(12) United States Patent
Chin

(10) Patent No.: US 7,244,641 B2
(45) Date of Patent: Jul. 17, 2007

(54) PROCESS SEQUENCE AND MASK LAYOUT TO REDUCE JUNCTION LEAKAGE FOR A DUAL GATE MOSFET DEVICE

(75) Inventor: Pin-Shyne Chin, Shinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 89 days.

(21) Appl. No.: 10/874,927

(22) Filed: Jun. 23, 2004

(65) Prior Publication Data

US 2005/0003596 A1    Jan. 6, 2005

Related U.S. Application Data

(63) Continuation of application No. 10/205,791, filed on Jul. 26, 2002, now Pat. No. 6,849,485.

(51) Int. Cl.
*H01L 21/336* (2006.01)
*H01L 21/8234* (2006.01)

(52) U.S. Cl. .................. 438/197; 438/216; 438/218; 438/585; 438/287; 438/294

(58) Field of Classification Search ................ 438/142, 438/197, 199, 218, 283, 585, 586, 587, 778, 438/216, 287, 294
See application file for complete search history.

(56) References Cited

U.S. PATENT DOCUMENTS 5,668,035 A    9/1997  Fang et al.
5,741,740 A    4/1998  Jang et al.
6,074,915 A    6/2000  Chen et al.
6,171,911 B1   1/2001  Yu
6,225,167 B1   5/2001  Yu et al.
6,274,469 B1 * 8/2001  Yu ............................. 438/592
2002/0105041 A1 8/2002 Goto et al.
2003/0008452 A1 * 1/2003 Takagi ........................ 438/218

OTHER PUBLICATIONS

Wolf et al. "Silicon Processing For The VLSI Era," vol. 1, Lattice Press, 1986, pp. 198, 384-386, 532-534, 541-542 and 556-557.

* cited by examiner

*Primary Examiner*—Zandra V. Smith
*Assistant Examiner*—Thanh Y. Tran
(74) *Attorney, Agent, or Firm*—Duane Morris LLP

(57) ABSTRACT

A method of forming a thin gate insulator layer comprises forming an active region surrounded by STI regions; forming a first insulator layer on the active device region; forming a patterned photoresist layer over the first insulator layer and a at least a portion of the STI regions; etching the first insulator layer to expose a portion of the active device region, wherein the photoresist layer substantially protects the STI regions during etching; forming a thin gate insulator layer on the exposed portion of the active device region, wherein said first insulator layer located on a remaining portion of said active device region is converted to a thicker second insulator layer; and forming a conductive gate structure overlying a first portion of the thin gate insulator layer while a second portion of the thin gate insulator layer not covered by the conductive gate structure is removed.

14 Claims, 4 Drawing Sheets

PROCESS SEQUENCE AND MASK LAYOUT TO REDUCE JUNCTION LEAKAGE FOR A DUAL GATE MOSFET DEVICE

CROSS REFERENCE TO RELATED APPLICATION

This application is a continuation of U.S. patent application Ser. No. 10/205,791 filed Jul. 26, 2002, now U.S. Pat. No. 6,849,485, the entirety of which is hereby incorporated by reference herein.

BACKGROUND OF THE INVENTION (1) Field of the Invention

The present invention relates to methods used to fabricate semiconductor devices, and more specifically to a method, and a design layout used, to optimize the yield of dual gate metal oxide semiconductor field effect transistor (MOSFET) devices.

(2) Description of Prior Art

Specific devices designed to provide dual voltage applications, particularly for the deep sub-micron technology, are achieved using two different gate insulator layer thicknesses, sometimes referred to as a dual gate oxide technology. However the process sequences used to form dual gate insulator layers can result in unwanted device leakage phenomena. For example a process used to form two different gate insulator layers entails removal of a first insulator layer, exposing first portions, or active device regions of a semiconductor substrate in which a thin gate insulator layer will be regrown on. Portions of unremoved first insulator layer located on second areas of the semiconductor substrate, now subjected to conditions used to grow the thin gate insulator layer will increase in thickness resulting in a second gate insulator layer located on second portions, or portions of the semiconductor substrate to be used for thicker gate insulator devices, with the second gate insulator layer greater in thickness than the thin gate insulator layer, again located on the thin gate insulator active device portions of the semiconductor substrate.

Although the process sequence described above can be used to obtain two gate insulator thicknesses, several vulnerable situations can be present. First, shallow trench isolation (STI) regions comprised of insulator filled shallow trench shapes is subjected to the process used to remove the first insulator layer. In addition to global recessing of the STI regions, local recessing or notching of the STI region, at the interface of the STI—active device region, can result in regions in which conductive materials used for gate and silicide regions, can be difficult to remove, resulting in gate to substrate leakage or shorts. In addition the dry etch definition of a gate structure, performed exposing the thin gate insulator in the active device region for the devices employing thin gate insulator layers, can result in silicon loss if the thin gate layer is removed during the gate definition procedure, again resulting in unwanted leakages as a result of substrate damage.

The present invention will describe a novel process sequence and mask layout in which the amount of STI area subjected to the process used to clear a subsequent active device region for thin gate insulator formation, is reduced. In addition this invention will describe a novel process sequence and mask layout, in which the amount of thin gate insulator area subjected to the gate structure definition procedure, is reduced. Prior art, such as: Yu et al, in U.S. Pat. No. 6,225,167 B1; Yu, in U.S. Pat. No. 6,171,911 B1; Fang et al, in U.S. Pat. No. 5,668,035; and Chen et al, in U.S. Pat. No. 6,074,915; all describe processes used to form dual gate insulator layers. However these prior arts do not describe the novel mask layout—process sequence combination disclosed in this present invention, in which STI recess and silicon damage is reduced during the process sequence used to fabricate dual gate insulator layers.

SUMMARY OF THE INVENTION

It is an object of this invention to fabricate a semiconductor device featuring two gate insulator thicknesses, a thin gate insulator layer for low voltage applications, and a thicker gate insulator layer for higher voltage applications.

It is another object of this invention to reduce STI recessing and notching occurring during insulator removal in the active device region used for the thin gate insulator, or low voltage application, via use of a novel photolithographic mask layout.

It is still another object of this invention to prevent silicon damage in the active device region of the thin gate insulator layer application, during definition of a gate structure, via use of a novel process sequence allowing the presence of thicker insulator layer to be used as an etch stop layer.

In accordance with the present invention a method of reducing silicon damage and reducing notching and recessing of insulator filled shallow trench regions, during the fabrication of a thin gate insulator gate layer, of dual gate insulator layer device, is described. A first insulator layer is grown on the portion of semiconductor substrate exposed in an active device region to be used for the thin gate insulator layer of the dual gate insulator device, with the active device region located between shallow trench isolation (STI) regions. Photolithographic procedures result in exposure of a first portion of the first gate insulator layer, while a second portion of the first gate insulator layer, and portions of the STI regions are not exposed. Removal of exposed portions of the first insulator layer via wet etch procedures result in an active device region now comprised of a first area of exposed semiconductor substrate and second areas of unetched first insulator layer located adjacent to the first area of exposed semiconductor substrate. Thermal growth of the thin gate insulator layer on the exposed first area of the active device region also results in additional insulator growth on portions of first insulator layer located in second areas of the active device region, resulting in a thicker second insulator layer. Deposition of, and patterning of a conductive layer, results in definition of a conductive gate structure overlying the thin gate insulator layer in the first area of the active device region. The thicker second insulator layer, located in the second areas of the active device region, exposed during the gate structure definition procedure, prevented damage to, and loss of, underlying semiconductor material. A thicker gate insulator layer, of the dual gate insulator layer, previously grown and located in a different active device region of the semiconductor substrate, is also overlaid with a conductive gate structure during gate structure definition procedure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
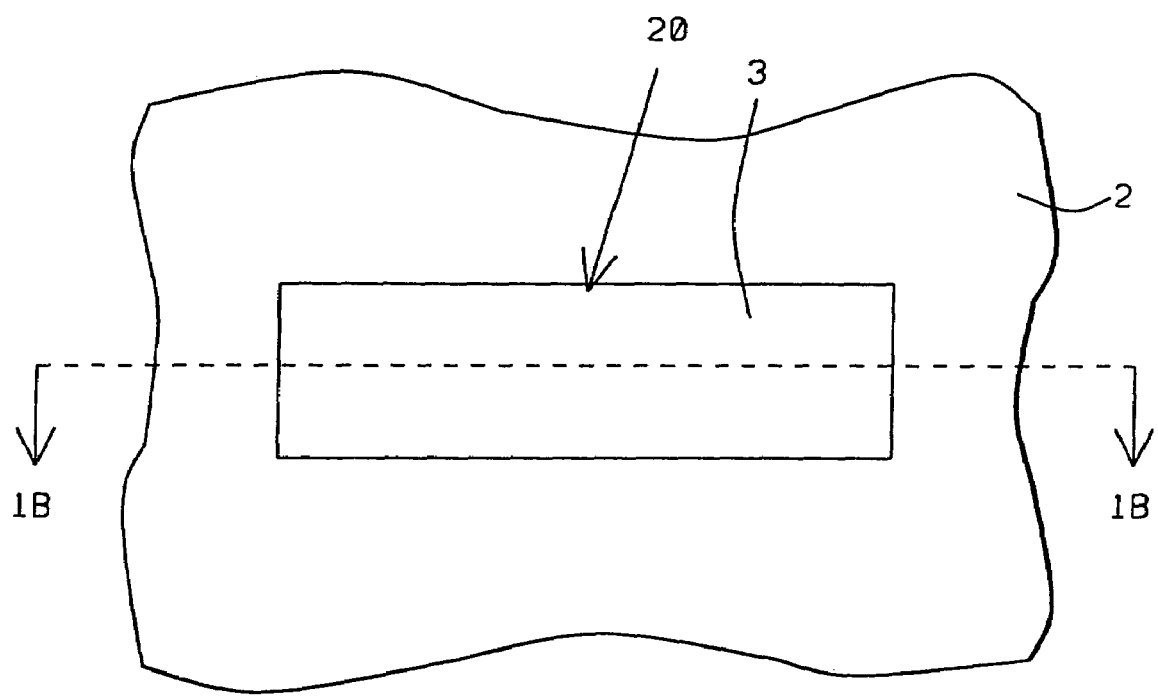
FIGS. 1A and 2A, which schematically show top views of the active device region used to accommodate the thin gate insulator layer, at various stages of the fabrication.
Figure 1B:
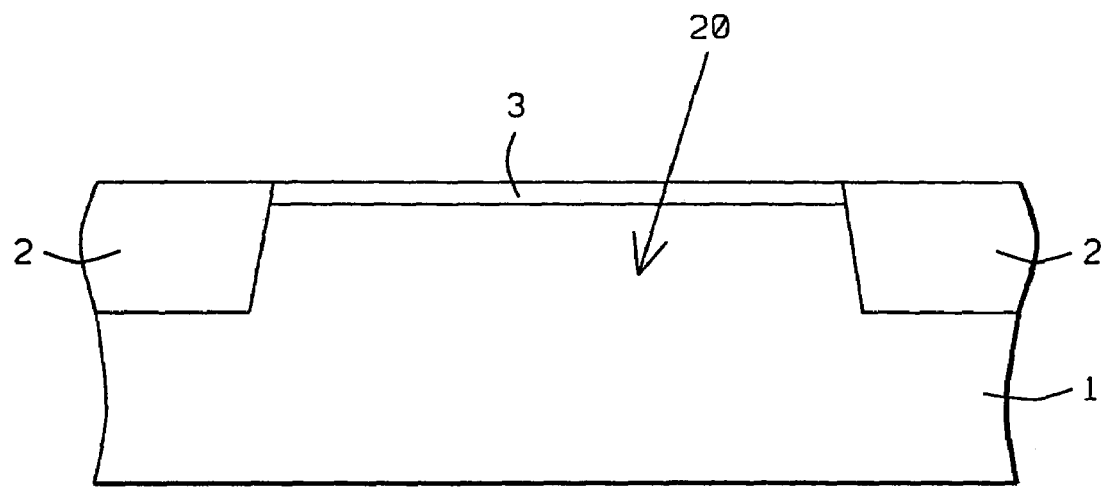
FIGS. 1B, 2B, and 3–6, which schematically, in cross-sectional style, show key stages of fabrication use to form the thin gate insulator layer of a dual gate insulator device.
Figure 2A:
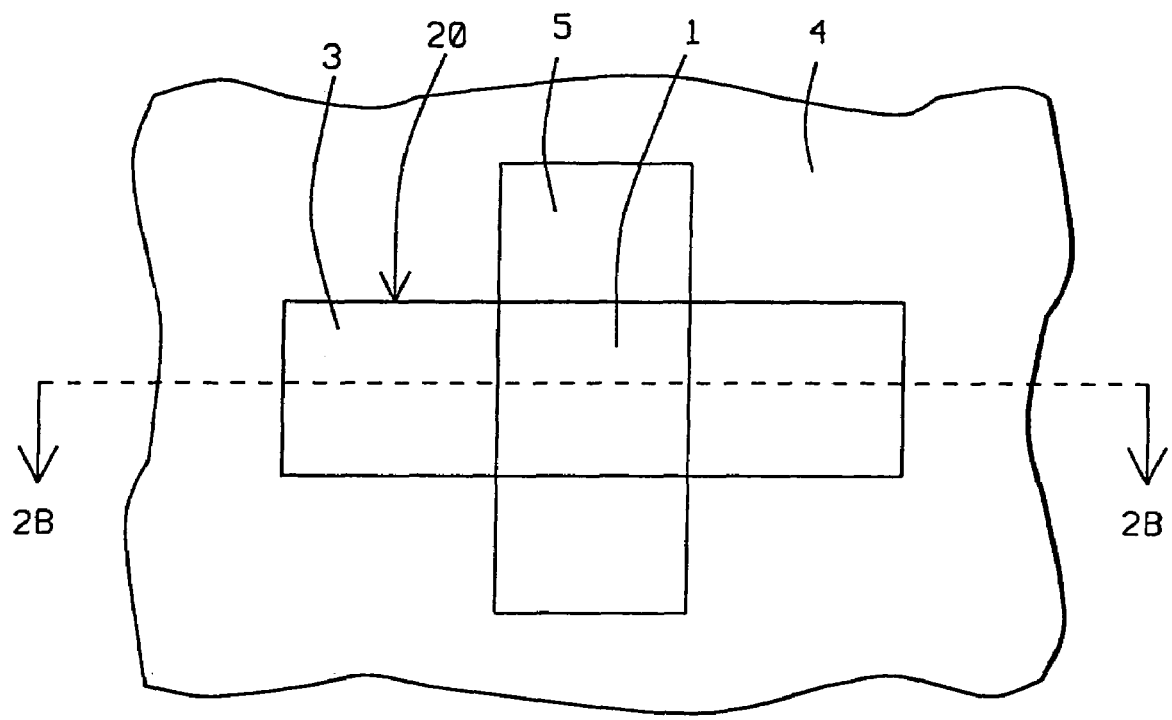
Figure 2B:
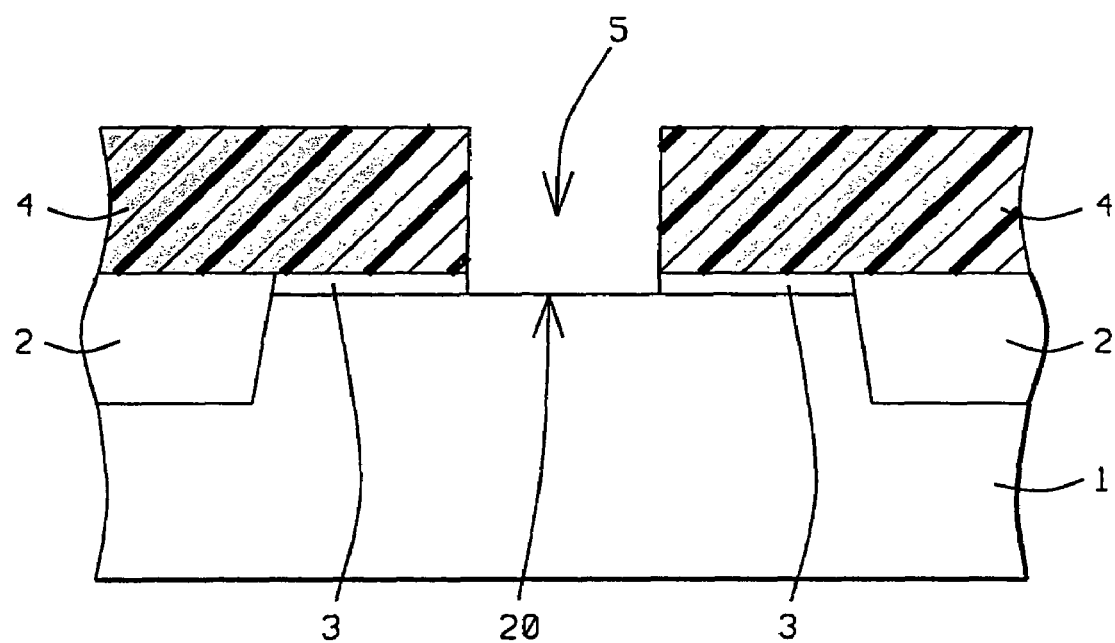

The method of forming a thin gate insulator layer for a device comprised with dual gate insulator layers, featuring a reduction of silicon damage, and a reduction of STI recessing and notching, both occurring during the thin gate insulator fabrication sequence, will now be described in detail. Semiconductor substrate 1, comprised of single crystalline silicon, featuring a <100> crystallographic orientation, is used and schematically shown in FIG. 1B. Shallow trench isolation (STI) regions 2, are next formed in portions of semiconductor substrate 1. This is accomplished via definition of shallow trench shapes in semiconductor substrate 1, via photolithographic and dry etch procedure, to a depth between about 2000 to 6000 Angstroms, followed by filling of the shallow trench shapes with silicon oxide obtained via chemical vapor deposition procedures, using tetraethylorthosilicate (TEOS), as a source. Unwanted portions of the silicon oxide are removed via chemical mechanical polishing procedures resulting in the attainment of STI regions 2. Portions of semiconductor substrate 1, not occupied by STI regions 2, are used as active device regions 20, the regions of the dual gate insulator device used to accommodate the thin gate insulator component. First insulator layer 3, comprised of silicon dioxide, is next thermally grown on active device region 20, to a thickness between about 50 to 250 Angstroms, at a temperature between about 800 to 1100° C., in an oxygen-steam ambient. This is schematically shown in cross-sectional style in FIG. 1B, and schematically shown as a top view in FIG. 1A A photolithographic plate is next used to create photoresist shape 4, featuring opening 5, which exposes the portion of first insulator layer 3, located on a first area of active device region 20. This is shown schematically in top view 2A, and in cross-sectional style in FIG. 2B. The novel layout of the photolithographic plate minimized the exposure of STI regions 2, during the subsequent removal of the portions of first insulator layer 3, exposed in opening 5. First insulator layer 3, exposed in opening 5, of photoresist shape 4, is removed from a first area of active device region 20, via wet etch procedures using a buffered, or dilute hydrofluoric acid solution, exposing a portion of the surface of semiconductor substrate 1, in a first area of active device region 20. The novel feature of the photolithographic plate is the allowance of only a first area of active device region 20, to be cleared of first insulator layer 3, maintaining first insulator layer 3, in second areas of active device region 20. In addition the design layout of this photolithographic plate minimized the amount of STI area exposed to the HF procedure, thus minimizing notching at the active device region—STI interface, and limiting the amount of STI area subjected to recessing during the HF procedure.

Figure 3:
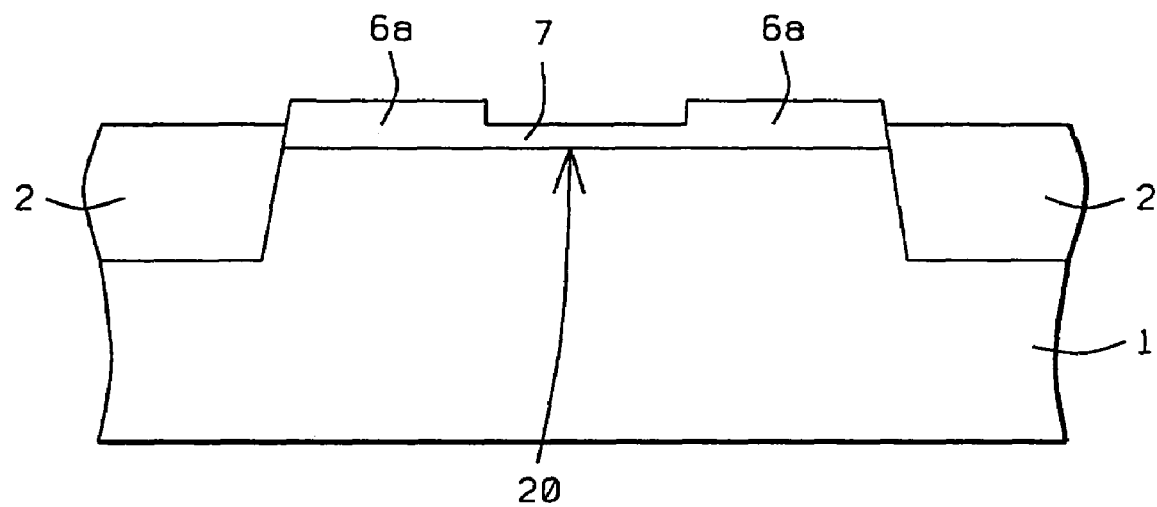

After removal of photoresist shape 4, via plasma oxygen ashing procedures, thin gate insulator layer 7, is formed on the portion of semiconductor substrate 1, exposed in the first area of active device region 20. Thin gate insulator layer 7, comprised of silicon dioxide, is thermally grown to a thickness between about 50 to 200 Angstroms, at a temperature between about 800 to 1100° C., in an oxygen-steam ambient. The same thermal oxidation procedures results in additional growth of first insulator layer 3, resulting in second insulator layer 6a, on second areas of active device region 20. Second insulator layer 6a, is comprised of silicon dioxide at a thickness between about 100 to 400 Angstroms. This is schematically shown in FIG. 3.

Figure 4:
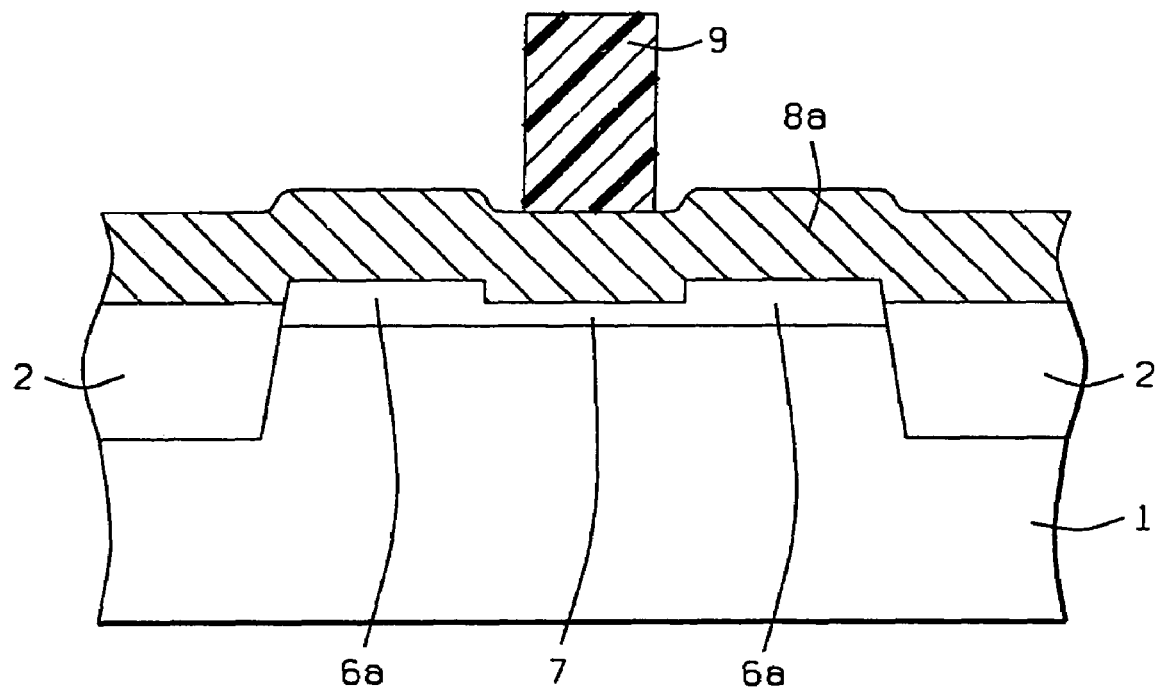

Conductive layer 8a, such as an in situ doped polysilicon layer, is next deposited via low pressure chemical vapor deposition (LPCVD), procedures, to a thickness between about 1000 to 2500 Angstroms. The polysilicon layer can also be deposited intrinsically rather than doped via implantation procedures. In addition if decreased word line resistance is desired, conductive layer 8a can be comprised of materials comprised of lower resistivity such as metal silicide or metal layers. Photoresist shape 9, is then formed on the portion of conductive layer 8a, which overlays only thin gate insulator layer 7, in the first area of active device region 20. This is schematically shown in FIG. 4.

Figure 5:
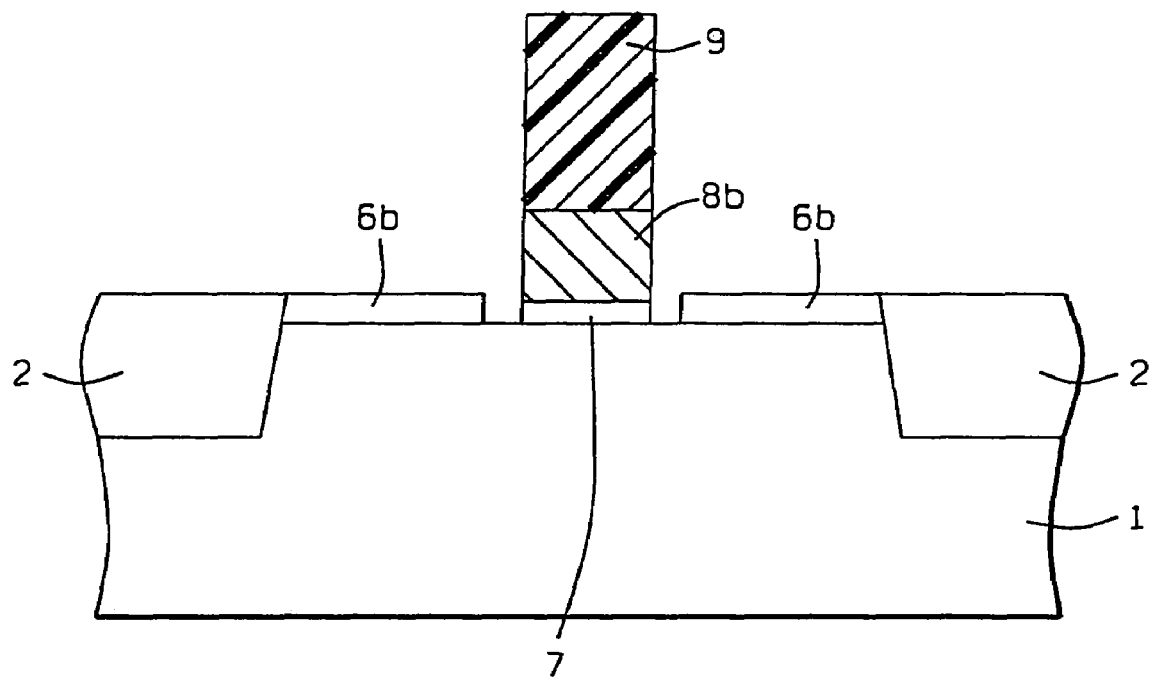

An anisotropic reactive ion etching (RIE), procedure is next employed to remove regions of conductive layer 8a, not covered by photoresist shape 9, resulting in conductive gate structure 8b, shown schematically in FIG. 5. The anisotropic RIE procedure is performed using $Cl_2$ or $SF_6$ as an etchant for conductive layer 8a, and although a high etch rate ratio of conductive layer 8a, to silicon dioxide, between about 10 to 1, to 20 to 1, does exist, at the conclusion of the conductive gate definition procedure portions of thin gate insulator layer 7, can be exposed and subjected to the RIE procedure resulting in partial or complete removal of exposed portions of thin gate insulator layer located adjacent to conductive gate structure 8b. However it should be noted that the thicker, second insulator layer 6a, located in second areas of active device region 20, exposed at the conclusion of the conductive gate definition procedure, protected all of the second area of active device region 20, from possible silicon damage. This was made possible via the previous implementation of the novel photolithographic plate design which allowed first insulator layer 3, to be protected from the wet etch removal procedure used to clear first insulator layer 3, from only a first area of active device region 20. Second insulator layer 6a, subjected to the gate structure definition procedure is now reduced to insulator layer 6b, at a thickness between about 150 to 300 Angstroms. Thus the use of the novel photolithographic plate design, in addition to the above described process sequence, allowed reduced areas of STI notching and recessing, as well as reduced areas of possible silicon damage of active device region 20, reducing the risk of junction leakage.

Figure 6:
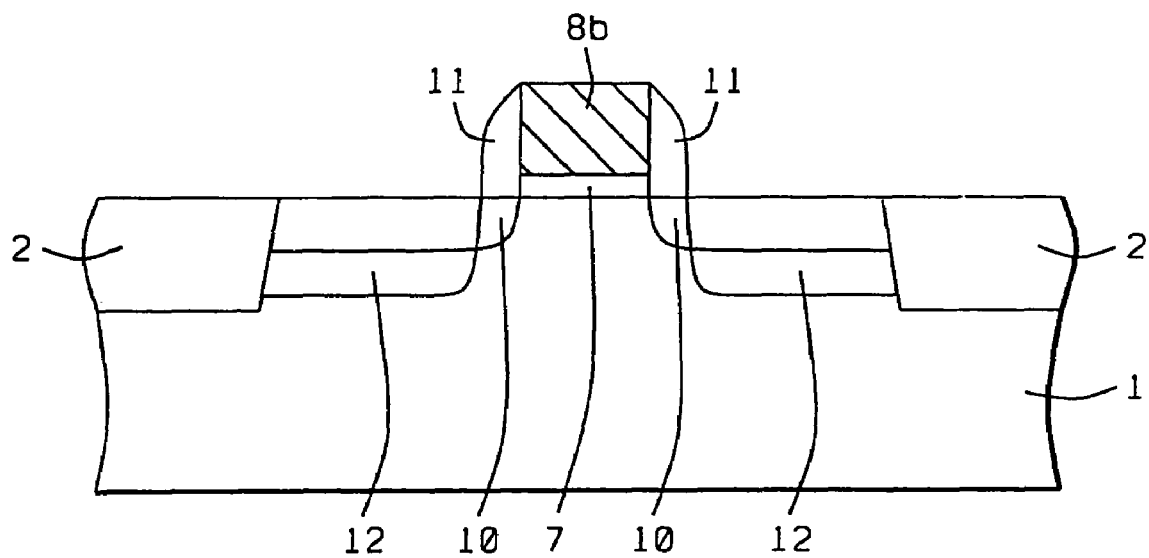

The conclusion of the process sequence, and novel photolithographic plate design layout, employed in the fabrication of the thin gate insulator layer of a dual gate insulator device, is next described. The thick gate insulator layer of the dual gate insulator layer, at this stage of processing may have been formed in other active device regions, prior to the formation of the thin gate insulator layer described in the previous sections of this invention, or second insulator layer 6b, can be used as the thick gate insulator layer. In either case conductive gate structure 8b, was defined overlying each gate insulator layer. The conclusion of this process sequence however will be applied to, and described for the thin gate insulator layer component of the dual gate insulator device. After removal of photoresist shape 9, via plasma oxygen ashing procedures, lightly doped source/drain region 10, is formed via implantation of ions into portions of semiconductor substrate 1, or into portions of active device region 20, not covered by conductive gate structure 8b. If the dual gate device is to be an N channel device, lightly doped source/drain region 10, is formed in a P well region, (not shown in the drawings), in semiconductor substrate 1, via implantation of arsenic or phosphorous ions, at an energy between about 10 to 70 KeV, at a dose between about 1E13 to 1E14 atoms/cm$^2$. If the dual gate device is to be a P channel device, lightly doped source/drain region 10, is formed in an N well region, (not shown in the drawings), in semiconductor substrate 1, via implantation of boron or BF$_2$ ions, at an energy between about 10 to 70 KeV, at a dose between about 1E13 to 1E14 atoms/cm$^2$. Insulator spacers 11, comprised of silicon oxide or silicon nitride, are next formed on the sides of conductive gate structure 8b. This is accomplished via deposition of silicon oxide or silicon nitride at a thickness between about 1000 to 3000 Angstroms, via LPCVD or via plasma enhanced chemical vapor deposition (PECVD) procedures, followed by a blanket, selective, anisotropric RIE procedure using CHF$_3$ or CF$_4$ as an etchant. The anisotropic RIE procedure also results in removal of second insulator 6b, from the top surface of the second areas of active device region 20. Heavily doped source/drain region 12, is next formed via ion implantation of ions into portions of the active device region not covered by conductive gate structure 8b, or by insulator spacers 11. Again if the dual gate device is to be an N channel device, heavily doped source/drain region 12, is formed in a P well region located in semiconductor substrate 1, via implantation of arsenic or phosphorous ions, at an energy between about 20 to 100 KeV, at a dose between about 5E14 to 1E16 atoms/cm$^2$. If the dual gate device is to be a P channel device, heavily doped source/drain region 12, is formed in an N well region in semiconductor substrate 1, via implantation of boron or BF$_2$ ions, at an energy between about 20 to 100 KeV, at a dose between about 5E14 to 1E16 atoms/cm$^2$. The result of these procedures is schematically shown in FIG. 6. The portion of the dual gate insulator device comprised with the thick gate insulator layer, is subjected to the same source/drain, insulator spacer formation procedures just described and used for the thin gate insulator layer component.

While this invention has been particularly shown and described with reference to, the preferred embodiments thereof, it will be understood by those skilled in the art that various changes in form and details may be made without departing from the spirit and scope of this invention.

What is claimed is:

1. A method of forming a thin gate insulator layer for a dual gate insulator, metal oxide semiconductor field effect transistor (MOSFET) device, on a semiconductor substrate, comprising the steps of:
   providing a portion of said semiconductor substrate surrounded by insulator filled, shallow trench isolation (STI) regions, to be used as an active device region;
   forming a first insulator layer on said active device region;
   forming a patterned photoresist layer over said first insulator layer and at least a portion of said STI regions;
   etching said first insulator layer through said patterned photoresist layer to expose a portion of said active device region, wherein said photoresist layer substantially protects said STI regions during said etching step;
   performing a procedure to form a thin gate insulator layer on said exposed portion of said active device region, with said procedure converting said first insulator layer located on a remaining portion of said active device region to a thicker second insulator layer; and
   performing a definition procedure to form a conductive gate structure overlying a first portion of said thin gate insulator layer while a second portion of said thin gate insulator layer not covered by said conductive gate structure is removed, and with said second insulator layer protecting said remaining portion of said active device region.

2. The method of claim 1, wherein said first insulator layer is a silicon oxide layer, at a thickness between about 50 to 250 Angstroms, obtained via thermal oxidation procedures performed at a temperature between about 800 to 1100° C., in an oxygen-steam ambient.

3. The method of claim 1, wherein said etching step comprises a wet etch procedure using a buffered hydrofluoric (BET), or a dilute hydrofluoric (DHF) solution.

4. The method of claim 1, wherein said procedure used to form said thin gate insulator layer on said exposed portion of said active device region, and to convert said first insulator layer to said second insulator layer, is a thermal oxidation procedure, performed at a temperature between about 800 to 1100° C., in an oxygen-steam ambient.

5. The method of claim 1, wherein said thin gate insulator layer is a silicon dioxide layer, at a thickness between about 50 to 200 Angstroms.

6. The method of claim 1, wherein said second insulator layer is a silicon dioxide layer, at a thickness between about 100 to 400 Angstroms.

7. The method of claim 1, wherein said conductive gate structure comprises doped polysilicon at a thickness between about 1000 to 2500 Angatroms.

8. The method of claim 1, wherein said definition procedure used to form said conductive gate structure is an anisotropic RIE procedure, using Cl$_2$ or SF$_6$ as an etchant for a conductive layer.

9. The method of claim 8, wherein the etch rate ratio of a conductive layer to silicon dioxide, during said definition procedure, is between about 10 to 1, to 20 to 1.

10. A method of forming a thin gate insulator layer as a component of a dual gate insulator MOSFET device, on a semiconductor substrate, comprising the steps of:
   forming insulator filled STI regions in a first portion of said semiconductor substrate, while a remaining bare, second portion of said semiconductor substrate, not occupied by said STI regions is used for an active device region;
   forming a first insulator layer on said active device region;
   forming a patterned photoresist layer over said first insulator layer;
   performing an etch procedure through said patterned photoresist layer to remove a first region of said first insulator layer from a first area of said active device region, while a second region of said first insulator layer located overlying a second area of said active device region is protected during said etch procedure;
   performing a procedure to form said thin gate insulator layer on said first area of said active device region, with said procedure changing said first silicon dioxide layer to a thicker, second insulator layer;
   depositing a conductive layer;
   performing a selective dry etch procedure to form a conductive gate structure on an underlying first portion of said thin gate insulator layer, while second portions of said thin gate insulator layer not covered by said conductive gate structure are removed, with said second insulator layer located in said active device region having sufficient thickness to protect an underlying portion of said active device region during said selective dry etch procedure;
   forming lightly doped source/drain regions adjacent said conductive gate structure;

after said lightly doped source/drain regions forming step, removing said second insulator layer located in said active device region;

forming spacers adjacent said conductive gate structure; and after said forming spacers step, forming heavily doped source/drain regions.

11. The method of claim 10, wherein portions of said STI regions are protected by said patterned photoresist layer during said etch procedure.

12. The method of claim 10 wherein said selective dry etch procedure, used to form said conductive gate structure, is an anisotropic RIE procedure, using $Cl_2$ or $SF_6$ as an etchant for a conductive layer.

13. The method of claim 12, wherein the etch rate ratio of a conductive layer to silicon dioxide, during said selective dry etch procedure, is between about 10 to 1, to 20 to 1.

14. The method of claim 10, wherein said spacers forming step comprises:

depositing a spacer insulator layer; and performing and anisotropic etch on said spacer insulator layer, wherein said spacers are formed and said second insulator layer located in said active device region is removed.

* * * * *

UNITED STATES PATENT AND TRADEMARK OFFICE
CERTIFICATE OF CORRECTION

PATENT NO. : 7,244,641 B2
APPLICATION NO. : 10/874927
DATED : July 17, 2007
INVENTOR(S) : Pin-Shyne Chin It is certified that error appears in the above-identified patent and that said Letters Patent is hereby corrected as shown below:

Column 6, Line 11, delete "(BET)" and insert therefore -- (BHF) --.

Column 6, Line 26, delete "Angastroms" and insert therefore -- Angstroms --.

Signed and Sealed this

Fourth Day of December, 2007

JON W. DUDAS
*Director of the United States Patent and Trademark Office*